(12) United States Patent
Lee et al.

(10) Patent No.: US 11,073,643 B2
(45) Date of Patent: Jul. 27, 2021

(54) NEAR-INFRARED ABSORBING FILM, OPTICAL FILTER COMPRISING THE SAME AND ELECTRONIC DEVICE

(71) Applicant: Samsung Electronics Co., Ltd., Suwon-si (KR)

(72) Inventors: Yong Joo Lee, Suwon-si (KR); Hyung Jun Kim, Suwon-si (KR); Jong Hoon Won, Yongin-si (KR); Yoon Seok Ko, Suwon-si (KR); Myungsup Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 354 days.

(21) Appl. No.: 16/268,662

(22) Filed: Feb. 6, 2019

(65) Prior Publication Data

US 2019/0302332 A1    Oct. 3, 2019

(30) Foreign Application Priority Data

Mar. 27, 2018    (KR) .......................... 10-2018-0035224

(51) Int. Cl.

| | | |
|---|---|---|
| *G02B 5/20* | (2006.01) | |
| *G02B 1/04* | (2006.01) | |
| *G02B 5/00* | (2006.01) | |
| *H01L 27/30* | (2006.01) | |
| *G02B 5/22* | (2006.01) | |
| *C09B 57/00* | (2006.01) | |

(52) U.S. Cl.
CPC .............. *G02B 5/208* (2013.01); *G02B 1/04* (2013.01); *G02B 5/003* (2013.01); *G02B 5/223* (2013.01); *H01L 27/307* (2013.01); *C09B 57/007* (2013.01)

(58) Field of Classification Search
CPC ... G02B 5/208; G02B 5/223; H01L 27/14621; H01L 27/14623; H01L 27/14625; C09B 57/007
See application file for complete search history.

(56) References Cited

U.S. PATENT DOCUMENTS

| | | | |
|---|---|---|---|
| 5,543,086 A | 8/1996 | Bertelson et al. | |
| 9,090,776 B2 | 7/2015 | Steppel et al. | |
| 9,575,213 B2 | 2/2017 | Nagaya et al. | |
| 9,746,595 B2 | 8/2017 | Nagaya et al. | |
| 9,791,596 B2 | 10/2017 | Nagaya et al. | |
| 9,791,606 B2 | 10/2017 | Nagaya et al. | |
| 2014/0061505 A1 | 3/2014 | Steppel et al. | |
| 2015/0130008 A1* | 5/2015 | Muro ............... | H01L 27/14621 257/432 |
| 2015/0260889 A1 | 9/2015 | Shiono et al. | |
| 2017/0184765 A1 | 6/2017 | Shiono et al. | |
| 2018/0017720 A1* | 1/2018 | Arimura .................. | G02B 5/22 |
| 2018/0067243 A1* | 3/2018 | Shiono .................. | C09B 57/007 |
| 2018/0188428 A1* | 7/2018 | Arimura ................. | H01L 27/14 |
| 2018/0305552 A1 | 10/2018 | Matsumura et al. | |

FOREIGN PATENT DOCUMENTS

| | | |
|---|---|---|
| EP | 3480633 A1 | 5/2019 |
| JP | 2012-008532 A | 1/2012 |
| JP | 2015-176046 A | 10/2015 |
| KR | 2014-0088559 A | 7/2014 |
| KR | 2015-0023375 A | 3/2015 |
| KR | 2015-0094631 A | 8/2015 |
| WO | WO-2016-043166 A1 | 3/2016 |
| WO | WO-2017130825 A1 | 8/2017 |

OTHER PUBLICATIONS

Extended European Search Report dated Aug. 22, 2019, issued in corresponding European Application No. 19164416.0.

* cited by examiner

*Primary Examiner* — John A McPherson
(74) *Attorney, Agent, or Firm* — Harness, Dickey & Pierce, P.L.C.

(57) ABSTRACT

Disclosed are a near-infrared absorbing film including a polymer film, a first near-infrared absorbing layer and a second near-infrared absorbing layer on the polymer film. The first near-infrared absorbing layer may be configured to transmit light in a visible region and to selectively absorb at least one part of light in a near-infrared region. The second near-infrared absorbing layer may be disposed on a surface of the first near-infrared absorbing layer. The first near-infrared absorbing layer may include a dye represented by Chemical Formula 1. The second near-infrared absorbing layer may include a copper complex compound. An optical filter may include the near-infrared absorbing film. An electronic device may include the optical filter.

[Chemical Formula 1]

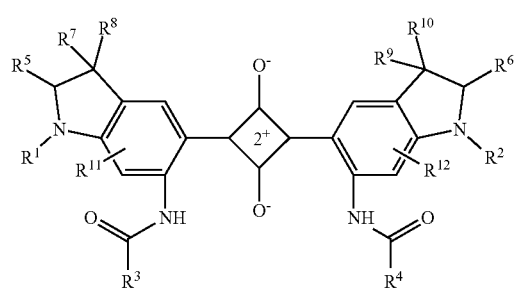

In Chemical Formula 1, $R^1$ to $R^{12}$ are described in the detailed description.

25 Claims, 14 Drawing Sheets

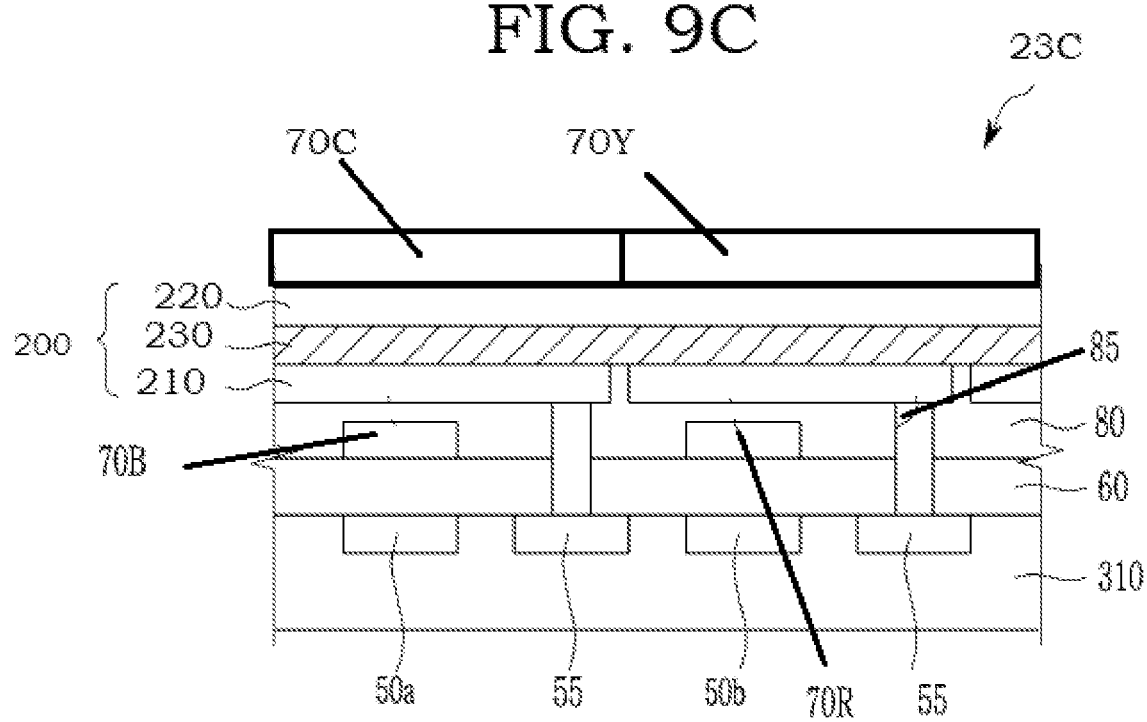

NEAR-INFRARED ABSORBING FILM, OPTICAL FILTER COMPRISING THE SAME AND ELECTRONIC DEVICE

CROSS-REFERENCE TO RELATED APPLICATION

This application claims priority to Korean Patent Application No. 10-2018-0035224, filed in the Korean Intellectual Property Office on Mar. 27, 2018, the entire contents of which are incorporated herein by reference.

BACKGROUND

1. Field

A near-infrared absorbing film, an optical filter including the same, and an electronic device including the optical filter are disclosed.

2. Description of Related Art

Recently, an electronic device including an image sensor that stores an image as an electrical signal, such as a cell phone, a digital camera, a camcorder and a camera, has been widely used.

This electronic device may include an optical filter including a near-infrared absorbing film in order to reduce or prevent generation of an optical distortion by light in the other regions than a visible region.

The near-infrared absorbing film is mounted in front of an image sensor of a camera module and thus plays a role of effectively absorbing an incident near-infrared ray and resolving the optical distortion phenomenon.

On the other hand, the near-infrared absorbing film is manufactured by coating a composition and drying the same, and a conventional composition includes a copper sulfonate salt. However, the copper sulfonate salt has very low near-infrared absorption capability (intensity), and thus has to be used in an excessive amount. Therefore, viscosity increase during preparation of high concentration copper salt solution may be caused, which is not desirable for manufacture of a thin film.

The use of an organic dye instead of a copper sulfonate salt has been suggested, but the organic dye may have a relatively narrow near-infrared absorption region range.

SUMMARY

Some example embodiments provide a near-infrared absorbing film having a thin thickness and capable of reducing or preventing optical distortion effectively.

Some example embodiments provide an optical filter including the near-infrared absorbing film.

Some example embodiments provide an electronic device including the optical filter.

According to some example embodiments, a near-infrared absorbing film includes a polymer film, a first near-infrared absorbing layer on the polymer film, and a second near-infrared absorbing layer on a surface of the first near-infrared absorbing layer. The first near-infrared absorbing layer may be configured to transmit light in a visible region and to selectively absorbing at least one part of light in a near-infrared region. The first near-infrared absorbing layer may include a dye represented by Chemical Formula 1 and the second near-infrared absorbing layer may include a copper complex compound.

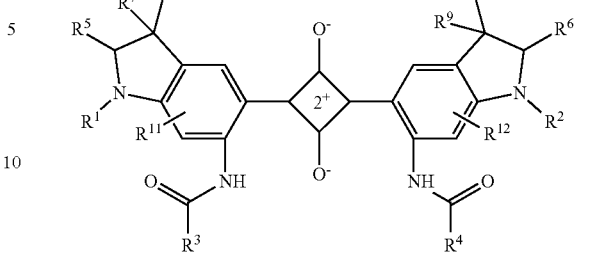

[Chemical Formula 1]

In Chemical Formula 1,
$R^1$, $R^2$, and $R^5$ to $R^{12}$ are independently one of a hydrogen atom, a substituted or unsubstituted C1 to C20 alkyl group, or a substituted or unsubstituted C6 to C20 aryl group, and
$R^3$ and $R^4$ independently include one of a substituted or unsubstituted C6 to C20 aryl group. $R^3$ and $R^4$ may independently be one of an unsubstituted C6 to C20 aryl group or a C6 to C20 aryl group substituted with a C1 to C10 alkyl group.

In some example embodiments, the dye represented by Chemical Formula 1 may have a maximum absorption wavelength (λmax) in a wavelength region of about 715 nm to about 725 nm.

In some example embodiments, the copper complex compound may include a copper phosphate salt.

In some example embodiments, the copper phosphate salt may include a structure represented by one of Chemical Formula 2-1 to Chemical Formula 2-3.

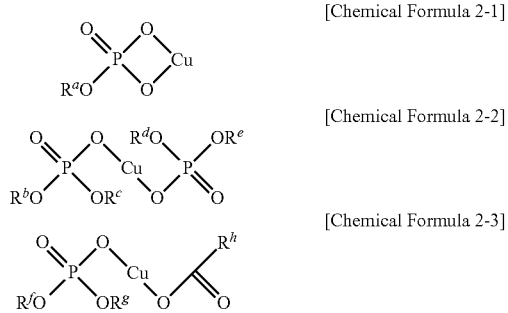

[Chemical Formula 2-1]

[Chemical Formula 2-2]

[Chemical Formula 2-3]

In Chemical Formula 2-1 to Chemical Formula 2-3,
$R^a$ to $R^h$ are independently one of a hydrogen atom or a substituted or unsubstituted C1 to C20 alkyl group.

In some example embodiments, the near-infrared absorbing film may have an average light transmittance of 50% in a wavelength region of about 630 nm to about 640 nm.

In some example embodiments, the first near-infrared absorbing layer may further include an organic binder.

In some example embodiments, the organic binder may include one of a thermally curable binder, a photo-curable binder, or a combination thereof.

In some example embodiments, the first near-infrared absorbing layer may further include one of a cyanine-based dye, a phthalocyanine-based dye, a dithiolene metal complex dye, a diimmonium-based dye, or a combination thereof.

In some example embodiments, the polymer film may include one of polyethyleneterephthalate, polyethylenenaphthalate, triacetyl cellulose, polycarbonate, cycloolefin polymer, poly(meth)acrylate, polyimide, or a combination thereof.

In some example embodiments, the polymer film may selectively absorb at least one part of light in an ultraviolet (UV) region.

In some example embodiments, the first near-infrared absorbing layer may be disposed between the polymer film and the second near-infrared absorbing layer.

In some example embodiments, the second near-infrared absorbing layer may be disposed between the polymer film and the first near-infrared absorbing layer.

In some example embodiments, the near-infrared absorbing film may have an average light transmittance of less than or equal to about 2.5% in a wavelength region of about 700 nm to about 740 nm.

According to some example embodiments, an optical filter may include the near-infrared absorbing film and an infrared blocking layer on one surface or both surfaces of the near-infrared absorbing film.

In some example embodiments, the infrared blocking layer may include a first layer and a second layer containing materials having different refractive indexes, and the infrared blocking layer may include a multilayer where the first layer and the second layer are alternately and repeatedly stacked.

In some example embodiments, the infrared blocking layer may block light in a wavelength region of about 700 nm to about 1200 nm.

In some example embodiments, the near-infrared absorbing film may have a thickness of about 50 μm to about 250 μm.

According to some example embodiments, an electronic device includes the optical filter.

In some example embodiments, the electronic device may include a lens, an image sensor, and the optical filter disposed between the lens and the image sensor.

According to some example embodiments, a near-infrared absorbing film includes a polymer film and a near-infrared absorbing layer on the polymer film. The near-infrared absorbing layer may include a dye represented by Chemical Formula 1 and a copper phosphate compound.

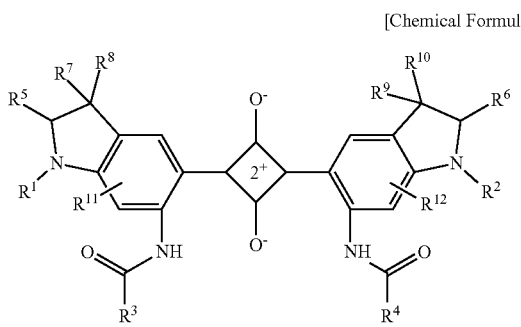

[Chemical Formula 1]

In Chemical Formula 1, $R^1$, $R^2$, and $R^5$ to $R^{12}$ are independently one of a hydrogen atom, a substituted or unsubstituted C1 to C20 alkyl group, or a substituted or unsubstituted C6 to C20 aryl group; and $R^3$ and $R^4$ may independently be one of an unsubstituted C6 to C20 aryl group or a C6 to C20 aryl group substituted with a C1 to C10 alkyl group.

In some example embodiments, the copper phosphate salt may include a structure represented by one of Chemical Formula 2-1 to Chemical Formula 2-3.

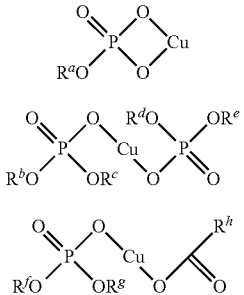

[Chemical Formula 2-1]

[Chemical Formula 2-2]

[Chemical Formula 2-3]

In Chemical Formula 2-1 to Chemical Formula 2-3, $R^a$ to $R^h$ are independently one of a hydrogen atom or a substituted or unsubstituted C1 to C20 alkyl group.

In some example embodiments, the near-infrared absorbing layer may further include one of a cyanine-based dye, a phthalocyanine-based dye, a dithiolene metal complex dye, a diimmonium-based dye, or a combination thereof.

In some example embodiments, the near-infrared absorbing layer may include a first near-infrared absorbing layer and a second near-infrared absorbing layer. The first near-infrared absorbing layer may include the dye represented by Chemical Formula 1. The second near-infrared absorbing layer may the copper phosphate compound. The first near-infrared absorbing layer may include a binder. The first near-infrared absorbing layer may include the dye represented by Chemical Formula in an amount that is in a range that is greater than 0 parts by weight and less than or equal to about 10 parts by weight based on 100 parts by weight of the binder.

In some example embodiments, an electronic device may include an image sensor and the near-infrared absorbing film on the image sensor.

The near-infrared absorbing film may have a thin thickness and may be capable of reducing and/or preventing light in a near-infrared region effectively; thus the near-infrared absorbing film may reduce and/or prevent optical distortion effectively.

DETAILED DESCRIPTION

Figure 1:
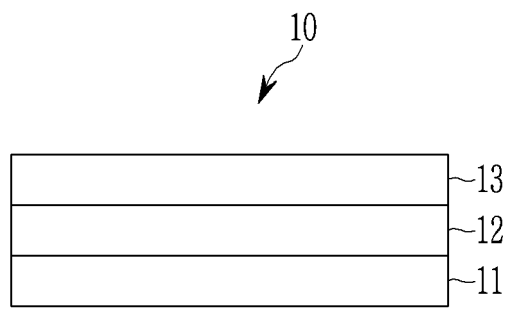
FIG. 1 is a schematic cross-sectional view showing a near-infrared absorbing film according to some example embodiments.

As used herein, when a specific definition is not otherwise provided, "alkyl group" refers to a C1 to C20 alkyl group and "aryl group" refers to a C6 to C20 aryl group.

As used herein, when a specific definition is not otherwise provided, "substituted" refers to replacement of at least one hydrogen by a halogen atom (F, Cl, Br, or I), a hydroxy group, a C1 to C20 alkoxy group, a (meth)acrylate group (e.g., a (meth)acryloxy group), a nitro group, a cyano group, an amine group, an imino group, an azido group, an amidino group, a hydrazino group, a hydrazono group, a carbonyl group, a carbamyl group, a thiol group, an ester group, ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when a definition is not otherwise provided, in a chemical formula, hydrogen is bonded at the position when a chemical bond is not drawn where supposed to be given.

As used herein, the average light transmittance refers to an average value of light transmittance measured when incident light is radiated in a vertical direction (front direction) of the optical filter.

As used herein, the maximum absorption wavelength ($\lambda_{max}$) refers to a peak absorption wavelength at which the absorption is maximum.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a near-infrared absorbing film according to some example embodiments is described.

A near-infrared absorbing film according to some example embodiments includes a polymer film, a first near-infrared absorbing layer disposed on the polymer film, and a second near-infrared absorbing layer disposed on the surface of the first near-infrared absorbing layer, wherein the first near-infrared absorbing layer includes a dye represented by Chemical Formula 1 and the second near-infrared absorbing layer includes a copper complex compound. The first near-infrared absorbing layer may transmit light in a visible region and selectively absorb light in at least one part of light (e.g., a range of light) in a near-infrared region.

[Chemical Formula 1]

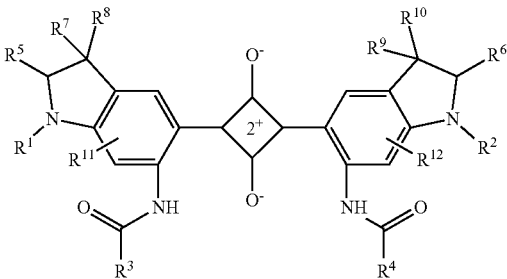

In Chemical Formula 1, $R^1$, $R^2$, and $R^5$ to $R^{12}$ are independently a hydrogen atom, a substituted or unsubstituted C1 to C20 alkyl group, or a substituted or unsubstituted C6 to C20 aryl group, and $R^3$ and $R^4$ are independently (or independently include) a substituted or unsubstituted C6 to C20 aryl group.

For example, $R^3$ and $R^4$ may independently be a C6 to C20 aryl group substituted or unsubstituted with a C1 to C10 alkyl group. For example, $R^3$ and $R^4$ may independently be an unsubstituted C6 to C20 aryl group or a C6 to C20 aryl group substituted with a C1 to C10 alkyl group. When $R^3$ and $R^4$ have the above substituent, the dye may secure a maximum absorption wavelength of greater than or equal to about 715 nm, for example, of about 715 nm to about 725 nm and thus may be used as a single absorption material having low transmittance in a near-infrared region.

The organic dye may have a relatively narrow near-infrared absorption region range and thus a limit alone in absorbing light all over near-infrared absorption region (a single organic dye is usefully used as a medical index material such as a cancer diagnosis for chemotherapy and the like, a clothes-coloring material, or the like).

Instead of having a monolayered structure, a near-infrared absorbing film according to some example embodiments may have a multi-layered structure (a 3 layered structure including a polymer film, a first near-infrared absorbing layer, and a second near-infrared absorbing layer), and the two near-infrared absorbing layers respectively may include a compound represented by Chemical Formula 1 (a dye) and a copper complex compound. Thus, the near-infrared absorbing film according to some example embodiments may solve the above conventional problem that the organic dye has a narrow near-infrared absorption region range and simultaneously, lower light transmittance down to less than or equal to about 3% (for example, less than or equal to about 2.5%) in a near-infrared region (for example, in a region of about 700 nm to about 770 nm, for example, about 700 nm to about 740 nm) and accordingly, may be appropriately used for an optical filter. In addition, since the dye represented by Chemical Formula 1 is included in the first near-infrared absorbing layer, while a copper complex compound is included in the second near-infrared absorbing layer, the near-infrared absorbing film according to some example embodiments maintains light transmittance of greater than or equal to about 80% in a visible region (for example, in a region of about 430 nm to about 565 nm) and simultaneously, and has a maximum absorption wavelength in a region of about 715 nm to about 725 nm. An optical filter including the near-infrared absorbing film according to some example embodiments may improve an optical distortion problem and a flare phenomenon (a phenomenon that light entering camera lens is reflected and dispersed and thus gathered in an image sensor), as a camera image sensor senses light in an infrared region. Furthermore, the near-infrared absorbing film according to some example embodiments has a wavelength region in which light transmittance is 50% in a range of about 630 nm to about 640 nm and accordingly, an optimal condition for commercial availability of a camera module and the like.

The first near-infrared absorbing layer may include a binder, such as an organic binder, an inorganic binder, an organic/inorganic binder, or a combination thereof. The binder is not particularly limited as long as it may mix with the dye represented by Chemical Formula 1 and/or may disperse the dye represented by Chemical Formula 1 and may attach the dye represented by Chemical Formula 1 to a polymer film that will be described later.

For example, the first near-infrared absorbing layer may further include an organic binder.

The organic binder may be an acrylic binder. For example, the acrylic binder may be a curable binder, for example a thermally curable binder, a photo-curable binder, or a combination thereof.

The binder may include methyl cellulose, ethyl cellulose, hydroxypropyl methyl cellulose (HPMC), hydroxypropyl cellulose (HPC), a xanthan gum, polyvinyl alcohol (PVA), polyvinyl pyrrolidone (PVP), carboxyl methyl cellulose, hydroxyethyl cellulose, or a combination thereof, but is not limited thereto.

The dye represented by Chemical Formula 1 may be included in the first near-infrared absorbing layer in an amount of less than or equal to about 10 parts by weight based on 100 parts by weight of the binder. When the dye represented by Chemical Formula 1 is included more than needed, a wavelength at which light transmittance is 50% is less than about 630 nm. When the wavelength at which light transmittance is 50% is less than about 630 nm, a red light transmittance dose becomes smaller, and accordingly, transmittance in the entire visible region needs to be adjusted.

For example, the dye represented by Chemical Formula 1 may be included in an amount of about 0.1 parts by weight to about 10 parts by weight based on 100 parts by weight of the binder. When the dye represented by Chemical Formula 1 is included in an amount of less than about 0.1 parts by weight based on 100 parts by weight of the binder, light transmittance in a near-infrared region, for example a region of about 700 nm to about 740 nm, may be greater than or equal to about 4% and/or greater than about 4%.

Figure 6:
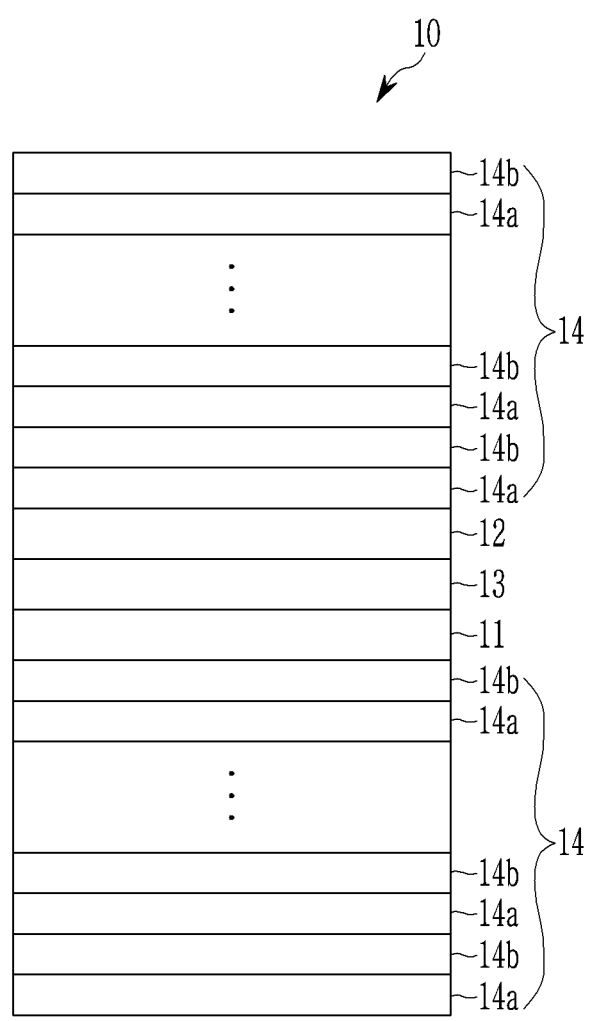

As shown in FIG. 6, because the dye represented by Chemical Formula 1 has an average absorbance in a near-infrared region (region of about 700 nm to about 740 nm) that is at least about 23 times, for example at least about 30 times as high as an average absorbance in a visible region (region of about 430 nm to about 565 nm), light transmittance in a visible region may be greater than or equal to about 85%, for example greater than or equal to about 88% while light transmittance in a near-infrared region may be less than or equal to about 9%, for example less than or equal to about 4%.

When the average absorbance in a near-infrared region is less than about 23 times as high as the average absorbance in a visible region, light transmittance in a visible region may be decreased and the above properties may not be obtained, and thus it is desirable as a near-infrared absorbing film.

The first near-infrared absorbing layer may further include a dye having a different structure from Chemical Formula 1. In this case, light transmittance in a wavelength region of about 740 nm to about 1200 nm may be improved.

The dye having a different structure from Chemical Formula 1 may include, for example, a polymethine compound (dye), a cyanine compound (dye), a phthalocyanine compound (dye), a merocyanine compound (dye), a naphthalocyanine compound (dye), an immonium compound (dye), a diimmonium compound (dye), a triarylmethane compound (dye), a dipyrromethene compound (dye), an anthraquinone compound (dye), a naphthoquinone compound (dye), a diquinone compound (dye), a rylene compound (dye), a perylene compound (dye), a squaraine compound (dye), a pyrylium compound (dye), a thiopyrylium compound (dye), a diketopyrrolopyrrole compound (dye), a dithiolene metal complex compound (dye), a derivative thereof, or a combination thereof, but is not limited thereto.

For example, the dye having a different structure from Chemical Formula 1 may be a cyanine-based dye, a phthalocyanine-based dye, a dithiolene metal complex dye, a diimmonium-based dye, or a combination thereof.

A wavelength region in which an average light transmittance of the dye represented by Chemical Formula 1 is 50% may range from about 630 nm to about 640 nm.

The dye represented by Chemical Formula 1 may have an average light transmittance of less than or equal to about 9%, for example less than or equal to about 4% in a wavelength region of about 700 nm to about 740 nm (near-infrared region).

The dye represented by Chemical Formula 1 may have an average light transmittance of greater than or equal to about 85%, for example greater than or equal to about 88% in a wavelength region of 430 nm to about 565 nm (visible region).

In some example embodiments, the first near-infrared absorbing layer may include a dye represented by one of Chemical Formulas 1-1 and 1-2.

[Chemical Formula 1-1]

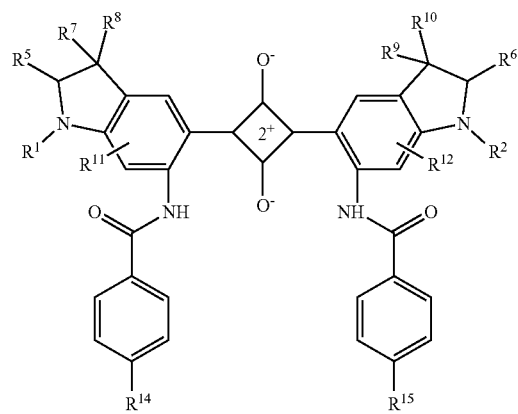

-continued

[Chemical Formula 1-2]

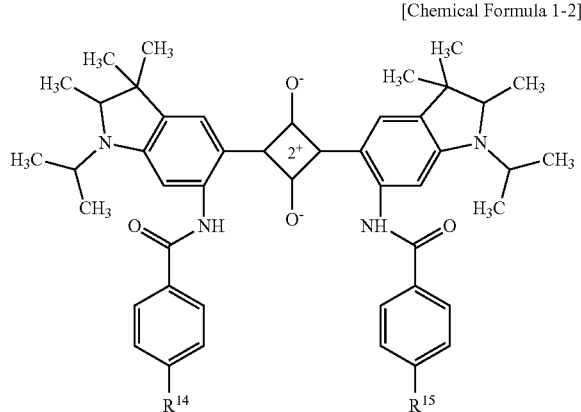

In Chemical Formula 1-1 and 1-2, $R^{14}$ and $R^{15}$ may each include a hydrogen atom or a substituted or un substituted C1 to C10 alkyl group.

The second near-infrared absorbing layer may be disposed on the upper surface of the polymer film 11 or on the upper/lower surface of the first near-infrared absorbing layer 12.

The second near-infrared absorbing layer 13 may include a copper complex compound, for example a copper phosphate salt. The second near-infrared absorbing layer may additionally absorb light in a near-infrared wavelength region due to the copper phosphate salt and thereby optical distortion by light in a near-infrared wavelength region may be effectively decreased or prevented.

The copper phosphate salt may be represented by one of Chemical Formula 2-1 to Chemical Formula 2-3, but the structure of the copper phosphate salt is not limited thereto.

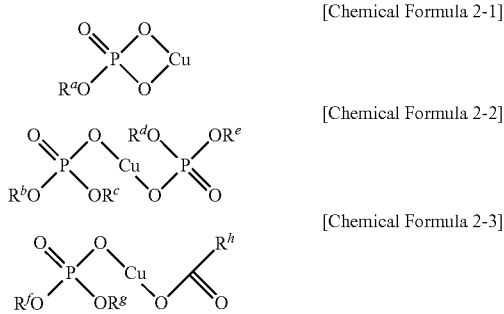

[Chemical Formula 2-1]

[Chemical Formula 2-2]

[Chemical Formula 2-3]

In Chemical Formula 2-1 to Chemical Formula 2-3, $R^a$ to $R^h$ are independently a hydrogen atom or a substituted or unsubstituted C1 to C20 alkyl group. For example, $R^a$ to $R^h$ may independently be a hydrogen atom, an unsubstituted C1 to C20 alkyl group, or a C1 to C20 alkyl group substituted with a (meth)acrylate group.

The near-infrared absorbing film 10 includes the polymer film 11 and the first near-infrared absorbing layer 12 and thereby transmits light in a visible region effectively and blocks light in a near-infrared region effectively. In addition, the near-infrared absorbing film 10 further includes a second near-infrared absorbing layer 13 and thereby may additionally absorb light in a near-infrared region, and may be applied to an electronic device; thus, a distortion of an optical signal of a visible region by light in a near infrared region may be decreased or prevented.

Figure 2:
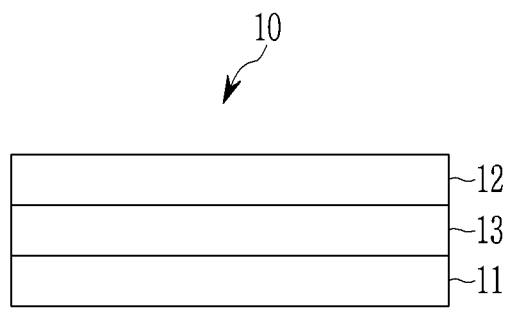
FIG. 2 is a schematic cross-sectional view showing a near-infrared absorbing film according to some example embodiments.

FIGS. 1 and 2 are independently schematic cross-sectional views showing near-infrared absorbing film according to some example embodiments.

Referring to FIGS. 1 and 2, a near-infrared absorbing film 10 according to some example embodiments includes a polymer film 11, a first near-infrared absorbing layer 12, and a second near-infrared absorbing layer 13. The first near-infrared absorbing layer 12 may be disposed between the polymer film 11 and the second near-infrared absorbing layer 13, or the second near-infrared absorbing layer 13 may be disposed between the polymer film 11 and the first near-infrared absorbing layer 12.

The polymer film 11 may be a transparent polymer film and have for example an average light transmittance of greater than or equal to about 80% in a visible region. Within the range, it may have an average light transmittance of greater than or equal to about 85%. Herein, the visible region may be for example a wavelength region of greater than about 380 nm and less than about 700 nm, for example about 430 nm to about 565 nm.

The polymer film 11 may include, for example polyethyleneterephthalate, polyethylenenaphthalate, triacetyl cellulose, polycarbonate, a cycloolefin polymer, poly(meth)acrylate, polyimide, or a combination thereof, but is not limited thereto.

The polymer film 11 may selectively absorb at least one part of light in an ultraviolet (UV) region. Herein, the ultraviolet (UV) region may be, for example a wavelength region of less than or equal to about 380 nm.

The polymer film 11 may absorb most of light in a wavelength region of at least about 350 nm to about 380 nm, and thus an average light transmittance of the near-infrared absorbing film 10 in a wavelength region of about 350 nm to 380 nm may be less than or equal to about 1%, for example less than or equal to about 0.8% or less than or equal to about 0.5%.

The polymer film 11 may include various additives according to required and/or desired properties of the near-infrared absorbing film 10.

The polymer film 11 may have a thickness of about 25 μm to about 105 μm, but is not limited thereto.

The first near-infrared absorbing layer 12 and the second near-infrared absorbing layer 13 may transmit light in a visible region and selectively absorbs at least one part of light in a near-infrared region respectively. Herein the visible region may be for example a wavelength region of greater than about 380 nm and less than about 700 nm, for example about 430 nm to about 565 nm and the near-infrared region may be for example a wavelength region of about 700 nm to about 1200 nm, about 780 nm to about 1200 nm, or about 700 nm to about 740 nm.

The first near-infrared absorbing layer 12 may be formed from a solution including the dye, the binder, and a solvent, and the second near-infrared absorbing layer 13 may be formed from a solution including the copper complex compound, the binder, and a solvent.

The solvent is not particularly limited, as long as it dissolves and/or disperses the dye, the copper complex compound and the binder and may be for example one or more selected from water; an alcohol based solvent such as methanol, ethanol, n-propyl alcohol, isopropyl alcohol, n-butanol, isobutanol, t-butanol, propylene glycol, propylene glycolmethylether, ethylene glycol, and the like; an aliphatic hydrocarbon solvent such as hexane, heptane, and the like; an aromatic hydrocarbon solvent such as toluene, pyridine, quinoline, anisole, mesitylene, xylene, and the like; a ketone-based solvent such as methyl isobutyl ketone, N-methyl-2-pyrrolidinone (NMP), cyclohexanone, acetone, and the like; an ether-based solvent such as tetrahydrofuran, isopropyl ether, and the like; an acetate-based solvent such as ethyl acetate, butyl acetate, propylene glycol methyl ether acetate, and the like; an amide-based solvent such as dimethylacetamide, dimethyl formamide (DMF), and the like; a nitrile-based solvent such as acetonitrile, benzonitrile, and the like; and a mixture of the solvents, but is not limited thereto.

The solution may be coated on the polymer film 11 or other near-infrared absorbing layer, dried, and optionally cured by heat and/or light. The coating may be for example a spin coating, a slit coating, a bar coating, a blade coating, a slot die coating, and/or an inkjet coating. The drying may be for example performed by natural drying, hot air drying, and/or a heat treatment at a higher temperature than the boiling point of the solvent.

The first near-infrared absorbing layer 12 and the second near-infrared absorbing layer 13 may independently have for example each thickness of about 1 μm to about 200 μm.

The near-infrared absorbing film 10 may have a structure where the polymer film 11, the first near-infrared absorbing layer 12, and the second near-infrared absorbing layer 13 are sequentially stacked (a stack order of the first near-infrared absorbing layer and the second near-infrared absorbing layer may be reversed), and thereby light in a visible region may be effectively transmitted and light in a near-infrared region may be effectively blocked and/or limited. In addition, light in an ultraviolet (UV) region may be effectively blocked and/or limited by imparting an absorption function of light in an ultraviolet (UV) region to the polymer film 11. Accordingly, the near-infrared absorbing film 10 may effectively sense light in a visible region in a sensor sensing light such as an image sensor by increasing purity of transmittance of light in a visible region of light in all wavelength regions and thus optical distortion by light besides visible region may be decreased or prevented.

The near-infrared absorbing film 10 may effectively transmit light in a visible region and selectively block light in a near-infrared region by a combination of the polymer film 11, the first near-infrared absorbing layer 12, and the second near-infrared absorbing layer 13.

For example, the near-infrared absorbing film 10 may have, for example an average light transmittance of greater than or equal to about 70% in a visible region of greater than about 380 nm and less than about 700 nm, for example an average light transmittance of greater than or equal to about 85% in a wavelength region of about 430 nm to about 565 nm.

For example, the near-infrared absorbing film 10 may have, for example an average light transmittance of less than or equal to about 20% in a near-infrared region of about 740 nm to about 1000 nm, or less than or equal to about 3% in a near-infrared region of about 700 nm to about 740 nm wavelength region.

For example, the near-infrared absorbing film 10 may have, for example a maximum absorption wavelength (λmax) in a wavelength region of about 700 nm to about 800 nm, a maximum absorption wavelength (λmax) in a wavelength region of about 700 nm to about 760 nm, or a maximum absorption wavelength (λmax) in a wavelength region of about 715 nm to about 725 nm.

The near-infrared absorbing film 10 may have, for example a thickness of about 50 μm to about 250 μm. Within the thickness range, a thin optical filter may be realized. For example, the thin optical filter may include the near-infrared absorbing film 10.

In this way, the near-infrared absorbing film 10 selectively absorbs light in a near-infrared wavelength region between a visible region and an infrared region of light in all wavelength regions and blocks it, and thereby a cross or mixing of a signal by light in a visible region and a signal by light in a non-visible region may be prevented to decrease or prevent optical distortion such as a crosstalk.

In addition, the near-infrared absorbing film 10 effectively absorbs light in a near-infrared region regardless of an incidence direction, and thus effectively absorbs incident light in a near-infrared region from a side direction and blocks it, and thereby a distortion of a signal by light in a visible region by incident light in a near-infrared region from a side may be decreased or prevented.

The near-infrared absorbing film 10 may be applied to all uses for filtering light in a near-infrared region, and may be, for example applied to a camera module and an electronic device including the same. The electronic device may be a digital camera, a camcorder, a monitoring camera such as CCTV, an in-car camera, a medical camera, a cell phone having a built-in or external camera, a computer having a built-in or external camera, a laptop computer having a built-in or external camera, and the like but is not limited thereto.

Figure 3:
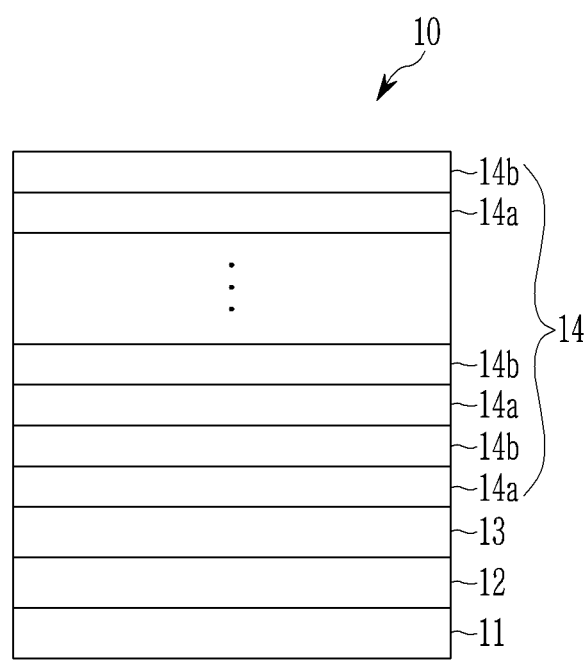
FIGS. 3 and 4 are a schematic cross-sectional view showing a near-infrared absorbing film according to some example embodiments.
Figure 4:
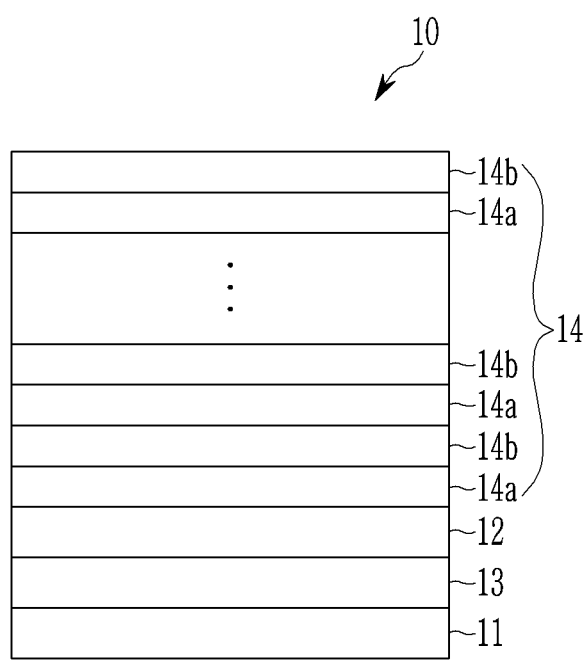
Figure 5:
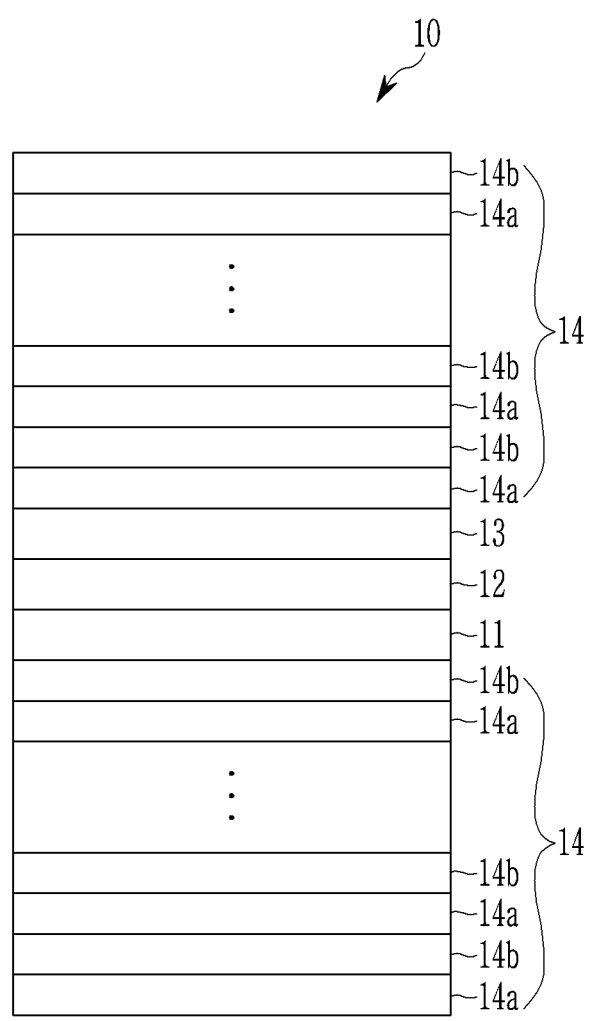
FIGS. 5 and 6 are a schematic cross-sectional view showing a near-infrared absorbing film according to some example embodiments.

FIGS. 3 and 4 are independently schematic cross-sectional views showing near-infrared absorbing film according to some example embodiments.

Referring to FIGS. 3-6, some example embodiments provide an optical filter including the near-infrared absorbing film and an infrared blocking layer 14 positioned on one side or both sides thereof, and some example embodiments provide an electronic device including the optical filter. The infrared blocking layer '4 may reflect light in a near-infrared wavelength region and thereby optical distortion by light in a near-infrared wavelength region may be effectively decreased or prevented.

The infrared blocking layer 14 is not particularly limited as long as it reflect lights in a near-infrared wavelength region, and may be for example a high refractive index reflective layer, a reflective layer including a high refractive index nanoparticle, or a multilayer including a plurality of layers having different refractive indexes, but is not limited thereto.

For example, the infrared blocking layer 14 may include a first layer 14a and a second layer 14b consisting of (or containing) materials having different refractive indexes, and may include a multilayer where the first layer 14a and the second layer 14b are alternately and repeatedly stacked.

The first layer 14a and the second layer 14b may be, for example a dielectric layer including an oxide layer, a nitride layer, an oxynitride layer, a sulfide layer, or a combination thereof, and for example the first layer 14a may have a refractive index of less than about 1.7 and the second layer 14b may have a refractive index of greater than or equal to about 1.7. Within the ranges, for example the first layer 14a may have a refractive index of greater than or equal to about 1.1 and less than about 1.7 and the second layer 14b may have a refractive index about 1.7 to about 2.7, or for example the first layer may have a refractive index of about 1.2 to about 1.6 and the second layer may have a refractive index of about 1.8 to about 2.5.

The first layer 14a and the second layer 14b may include any material having the refractive indexes within the ranges, and for example the first layer 14a may include a silicon oxide, an aluminum oxide, or a combination thereof and the second layer 14b may include titanium oxide, zinc oxide, indium oxide, zirconium oxide, or a combination thereof.

The first layer and the second layer may be, for example five-layered to 80-layered, for example 5-layered to 50-layered.

Thicknesses of the first layer 14a and the second layer 14b may be determined according to a refractive index and a reflection wavelength of each layer, for example each of the first layer 14a may have a thickness of about 10 nm to about 700 nm and each of the second layer 14b may have a thickness of about 30 nm to about 600 nm. Thicknesses of the first layer 14a and the second layer 14b may be the same or different.

The infrared blocking layer may have, for example a thickness of about 1 μm to about 10 μm.

Figure 7:
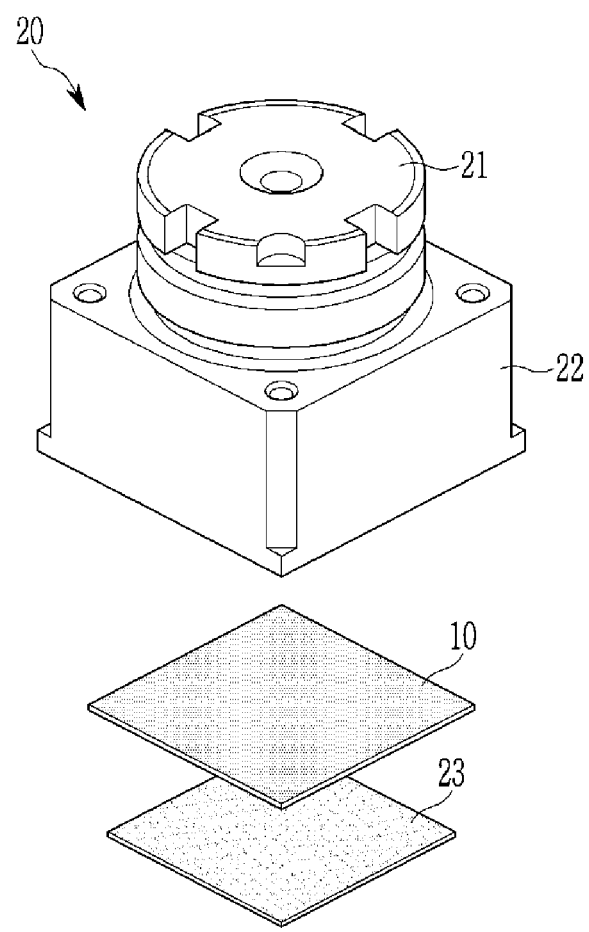
FIG. 7 is a schematic view showing a camera module including a near-infrared absorbing film according to some example embodiments.

FIG. 7 is a schematic view showing a camera module according to some example embodiments.

Referring to FIG. 7, a camera module 20 includes a lens barrel 21, a housing 22, a near-infrared absorbing film 10, and an image sensor 23. For example, the camera module may be an electronic device including a lens (lens barrel), an image sensor, and the optical filter disposed between the lens (lens barrel) and the image sensor.

The lens barrel 21 includes at least one lens imaging a subject, and the lens may be disposed along an optical axis direction. Herein, the optical axis direction may be a vertical direction of the lens barrel 21.

The lens barrel 21 is internally housed in the housing 22 and united with the housing 22. The lens barrel 21 may be moved in optical axis direction inside the housing 22 for autofocusing.

The housing 22 supports and houses the lens barrel 21 and may be open in the optical axis direction. Accordingly, incident light from one surface of the housing 22 may reach the image sensor 23 through the lens barrel 21 and the near-infrared absorbing film 10.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device other than the actuator may be adopted.

The near-infrared absorbing film 10 is the same as described above.

The image sensor 23 may concentrate an image of a subject and thus store it as data, and the stored data may be displayed as an image through a display media.

The image sensor 23 may be mounted in a substrate (not shown) and electrically connected with the substrate. The substrate may be, for example, a printed circuit board (PCB) or electrically connected to a printed circuit board, and the printed circuit may be, for example, flexible printed circuit (FPCB).

The image sensor 23 concentrates light passing the lens barrel 21 and the near-infrared absorbing film 10 and generates a video signal and may be a complementary metal-oxide semiconductor (CMOS) image sensor and/or a charge coupled device (CCD) image sensor.

Figure 8:
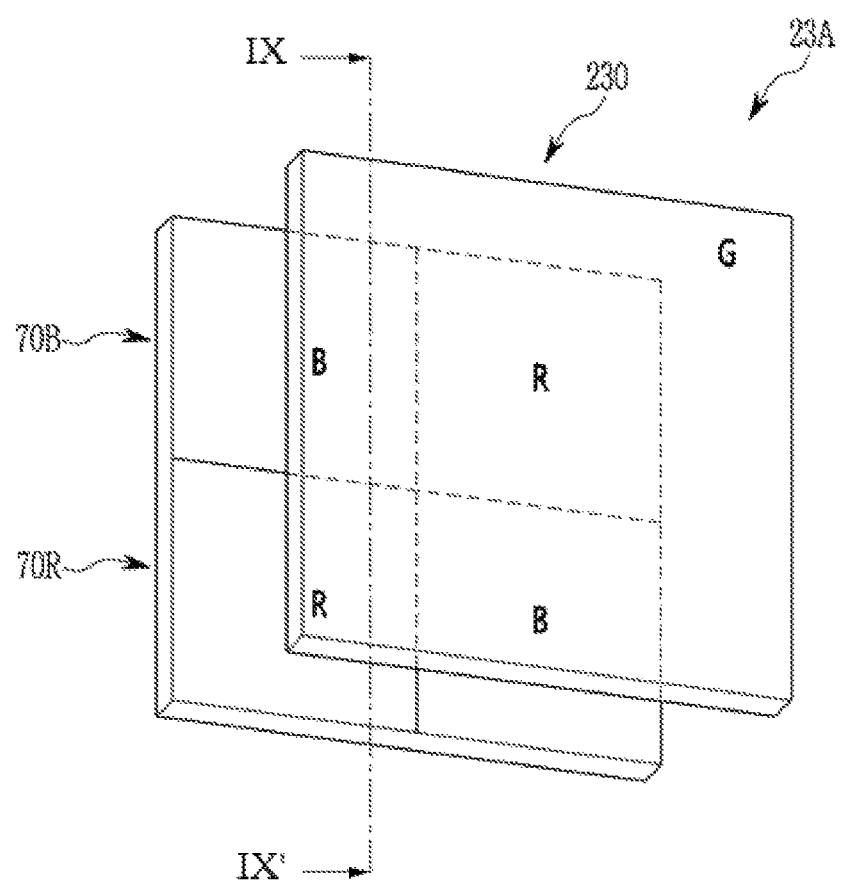
FIG. 8 is a top plan view showing an organic CMOS image sensor as one example of an image sensor.
Figure 9A:
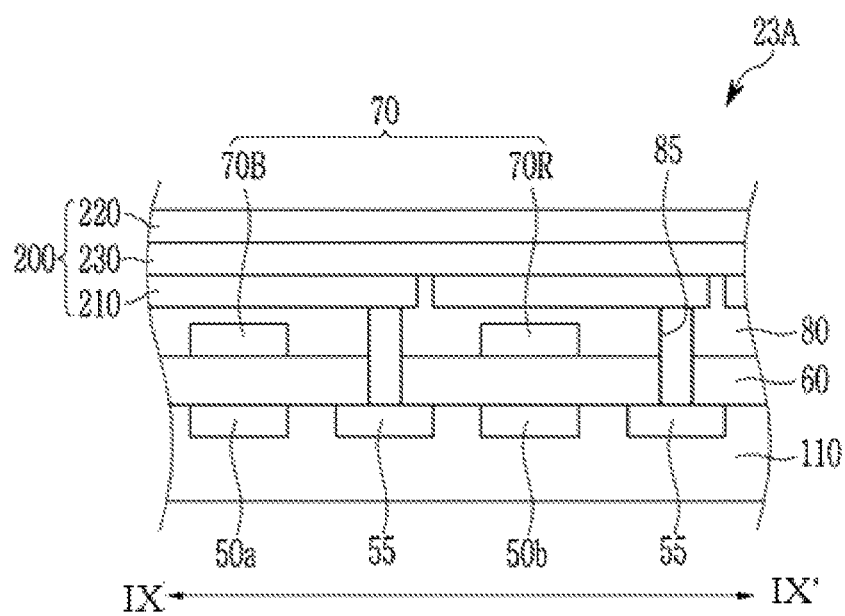
FIG. 9A is a cross-sectional view showing one example of the organic CMOS image sensor of FIG. 8, FIGS. 9B and 9C are cross-sectional views showing organic CMOS image sensors according to some example embodiments.

FIG. 8 is a top plan view showing an organic CMOS image sensor as an example of an image sensor and FIG. 9A is a cross-sectional view showing an example of the organic CMOS image sensor of FIG. 8.

Referring to FIGS. 8 and 9A, an organic CMOS image sensor 23A according to some example embodiments includes a semiconductor substrate 110 integrated with photo-sensing devices 50a and 50b, a transmission transistor (not shown), and a charge storage 55, a lower insulation layer 60, a color filter layer 70, a upper insulation layer 80, and an organic photoelectric device 200.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and for example as illustrated in the drawings, the photo-sensing devices 50a and 50b may be included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the organic photoelectric device 200, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 may include a first color filter layer over the photo-sensing device 50a that is a different color than a second color filter layer over the photo-sensing device 50b. As shown in FIGS. 8-9A, the color filter layer 70 may include a blue filter 70B formed in the blue pixel (e.g., region over the photo-sensing device 50a) and a red filter 70R formed in the red pixel (e.g., region over the over the photo-sensing device 50b). In FIGS. 8-9A, a green filter is not shown, but a green filter may be further included. Although FIGS. 8-9A illustrate an example where the color filter layer 70 includes a blue filter 70B and a red filter 70R, inventive concepts are not limited thereto and the color filter layer 70 may alternatively include color filter layers that for different colors.

The upper insulation layer 80 is formed on the color filter layer 70. The upper insulation layer 80 eliminates and/or reduces a step caused by the color filter layer 70 and smooth the surface. The upper insulation layer 80 and lower insulation layer 60 may include a contact hole (not shown) exposing a pad, and a through-hole 85 exposing the charge storage 55 of a green pixel.

The organic photoelectric device 200 is formed on the upper insulation layer 80. The organic photoelectric device 200 includes a lower electrode 210 and an upper electrode 220 facing each other and a light-absorbing layer 230 disposed between the lower electrode 210 and the upper electrode 220.

The lower electrode 210 and the upper electrode 220 may be all light-transmitting electrodes and the light-absorbing layer 230 may selectively absorb light in a green wavelength region and may replace a color filter of a green pixel.

As described above, the semiconductor substrate 110 and the organic photoelectric device 200 selectively absorbing light in a green wavelength region have a stack structure and thereby the size of an image sensor may be reduced to realize a down-sized image sensor.

Focusing lens (not shown) may be further formed on the organic photoelectric device 200. The focusing lens may control a direction of incident light and gather the light in one region. The focusing lens may have a shape of, for example, a cylinder or a hemisphere, but is not limited thereto.

In FIGS. 8 and 9A, a structure where the organic photoelectric device selectively absorbing light in a green wavelength region is stacked on the semiconductor substrate 110 is illustrated, but inventive concepts are not limited thereto. An organic photoelectric device selectively absorbing light in a blue wavelength region may be stacked on the semiconductor substrate 110 and a green photo-sensing device and a red photo-sensing device may be integrated in the semiconductor substrate 110 or an organic photoelectric device selectively absorbing light in a red wavelength region may be stacked on the semiconductor substrate 110 and a green photo-sensing device and a blue photo-sensing device may be integrated in the semiconductor substrate 110.

Among the light in a visible region passing the lens barrel 21 and the near-infrared absorbing film 10, light in a green wavelength region may be mainly absorbed in the light-absorbing layer 30 and photoelectrically converted, and light in a blue wavelength region and a red wavelength region may pass the lower electrode 210 and be sensed by the photo-sensing devices 50a and 50b.

Figure 9B:
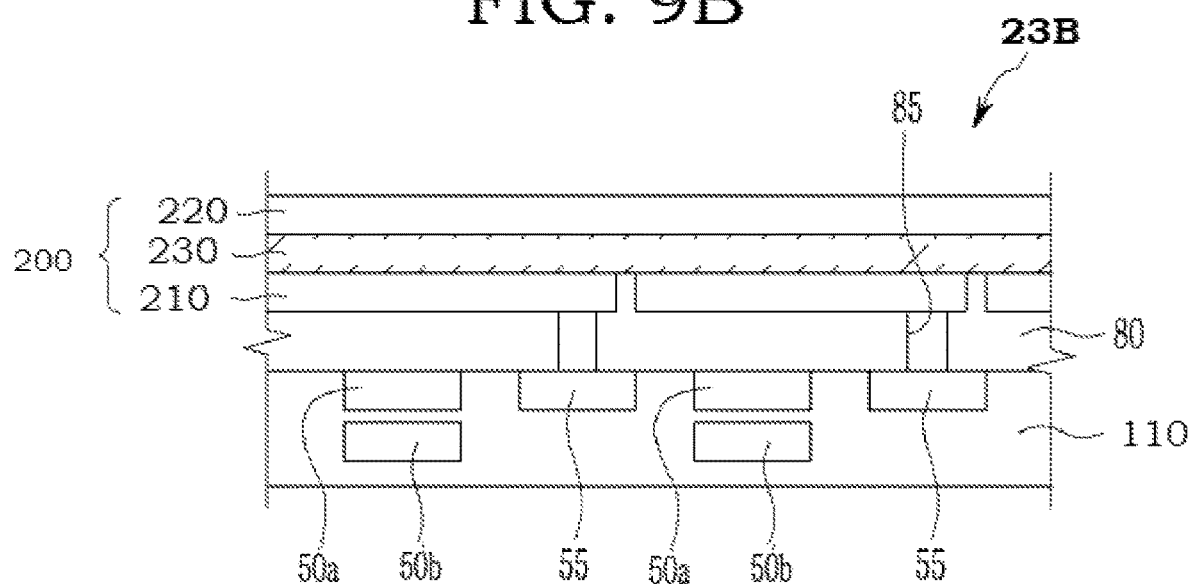
Figure 10:
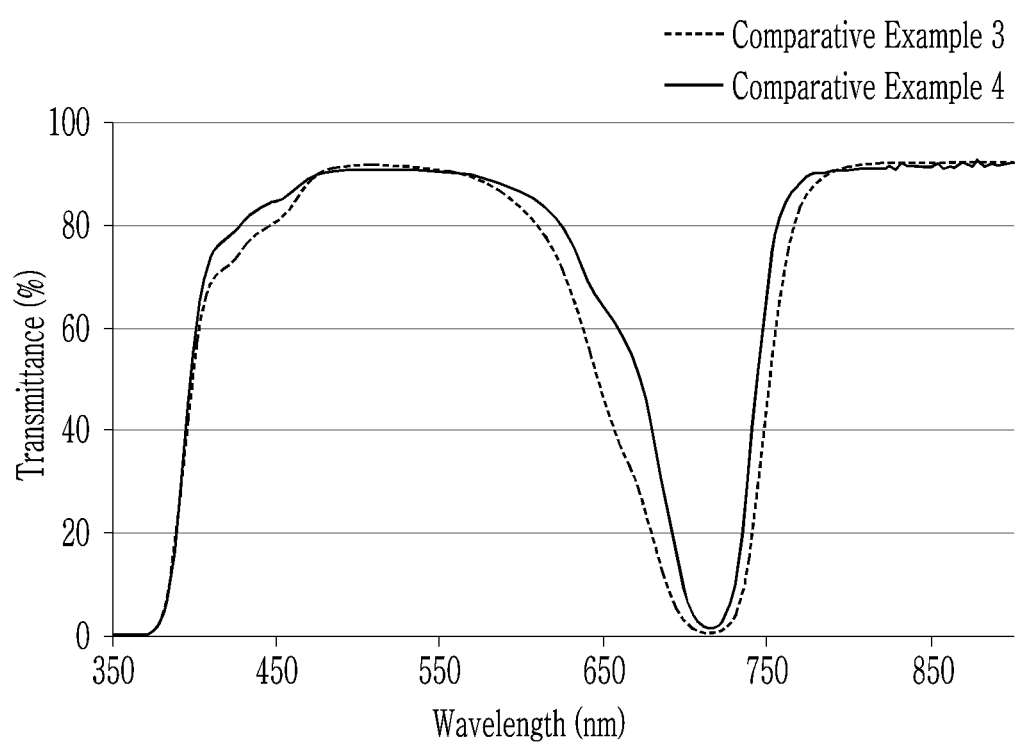
FIGS. 10 to 13 are respectively graphs showing light transmittances depending on a wavelength of the optical filters including the near-infrared absorbing film.
Figure 11:
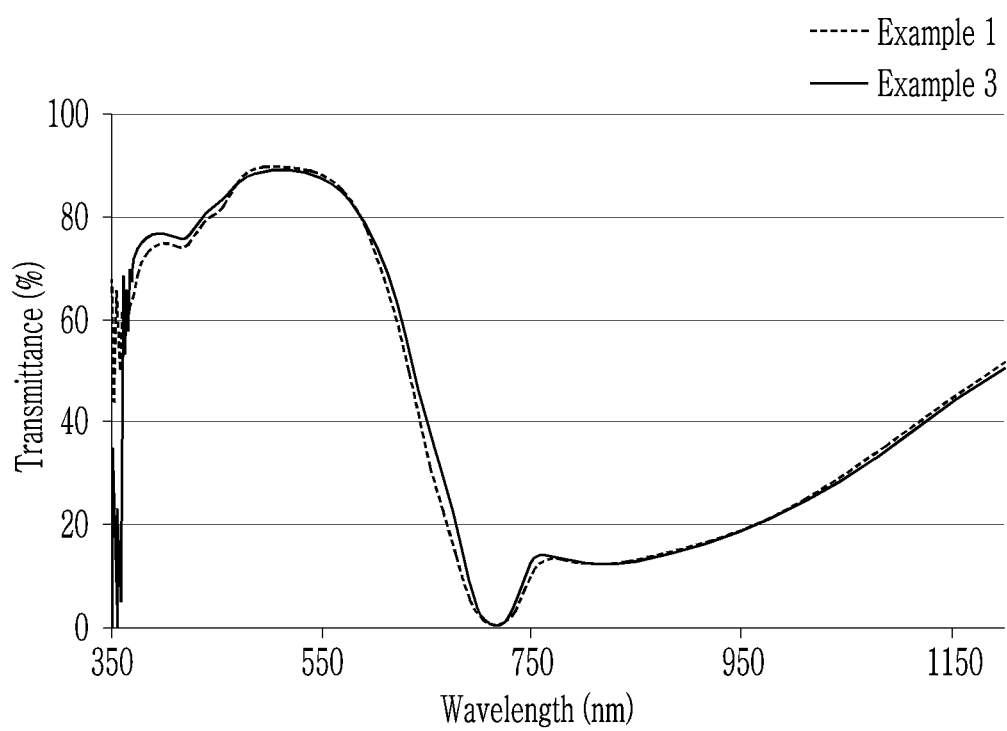
Figure 12:
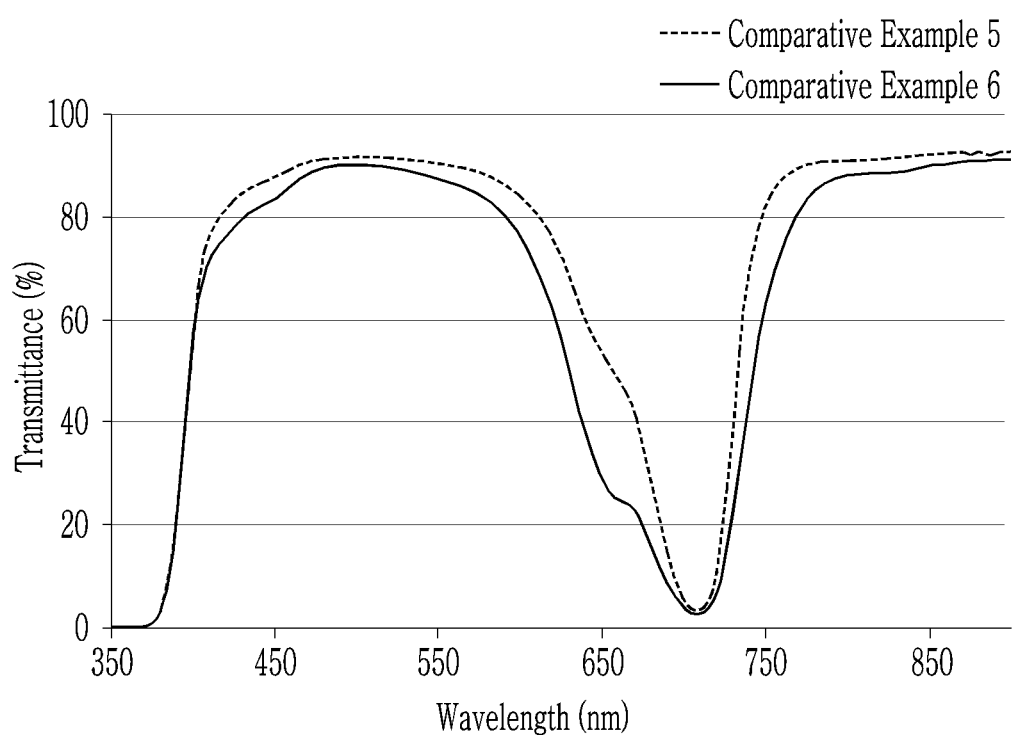
Figure 13:
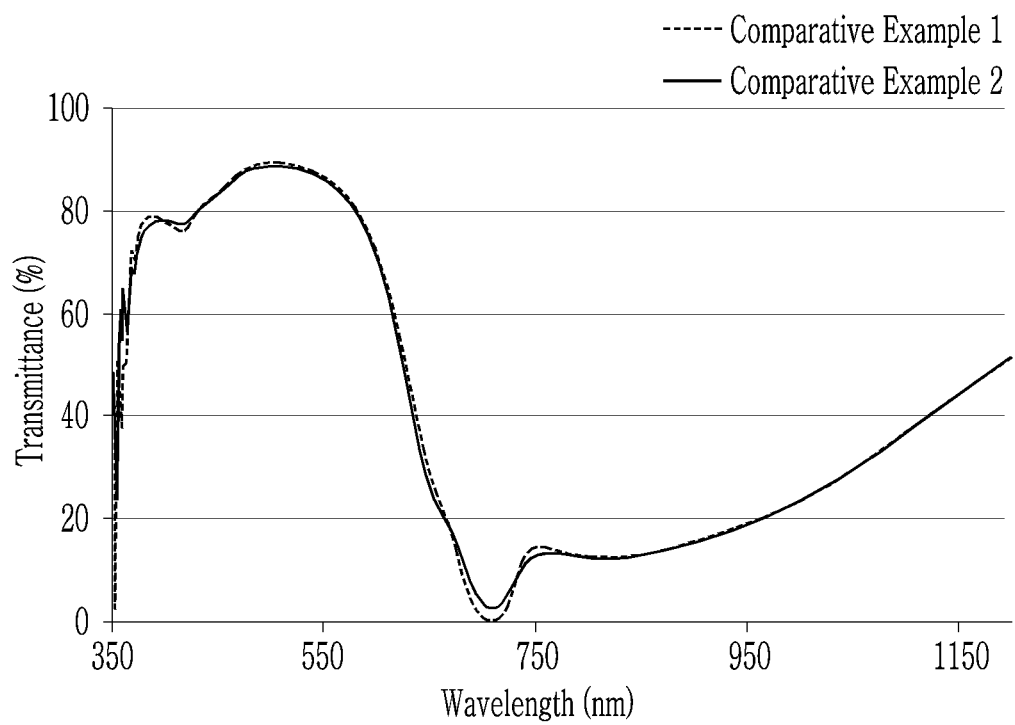

FIGS. 9B and 9C are cross-sectional views showing organic CMOS image sensors according to some example embodiments.

Referring to FIG. 9B, an image sensor 23B according to an example embodiment may have a similar structure to the image sensor 23A in FIG. 9A except the image sensor 23B may include the photo-sensing devices 50a and 50b stacked on top of each other in the substrate 110. The lower insulation layer 60 from the image sensor 23A may be eliminated in the image sensor 23B. Alternatively, in some embodiments, the lower insulation layer 60 may be formed between the lower upper insulation layer 80 and the substrate 110, as shown in FIG. 9A.

Referring to FIG. 9C, an image sensor 23C according to an example embodiment may have a similar structure to the image sensor 23A in FIG. 9A except the image sensor 23C may include a cyan filter 70C on the upper electrode 220 over a region including photo-sensing devices 50a and 55. A blue filter 70B may be between the lower insulation layer 60 and the upper insulation layer 80 over the photo-sensing device 60a. The image sensor 23C may further include a yellow filter 70Y on the upper electrode 220 over a region including photo-sensing devices 50b and 55. A red filter 70R may be between the upper insulation layer 80 and lower insulation layer 60 over the photo-sensing device 60b.

As described above, the near-infrared absorbing film 10 may effectively transmit light in a visible region but absorb and block light in a near-infrared region and thus transfer pure light in a visible region to an image sensor and resultantly, reduce or prevent a crosstalk generated when a signal by light in a visible region and a signal by light in a non-visible region are crossed and mixed in.

Hereinafter, inventive concepts are described in more detail with reference to examples. However, these examples are non-limiting, and inventive concepts not limited thereto.

Manufacture of Optical Filter Including Near-infrared Absorbing Film

Example 1

Composition 1 is prepared by dispersing Dye 1 and an acrylic binder (HT1335, Samhwa Paints Industrial Co., Ltd.) in a solvent (methyl ethyl ketone).

Composition 2 is prepared by dispersing Copper Phosphate Salt 1 and an epoxy binder (EHPE 3150, DAICEL Corp.) in a solvent (methyl ethyl ketone).

Composition 2 is bar-coated on a triacetyl cellulose film, dried at 85° C. for 1 minute, and thermally cured at 85° C. for 4 minutes to form a second near-infrared absorbing layer, and subsequently, Composition 1 is coated, dried, and thermally cured according to the same method as used for Composition 2 to form a first near-infrared absorbing layer on the second near-infrared absorbing layer and then, manufacture an optical filter (a triacetyl cellulose film/a second near-infrared absorbing layer/a first near-infrared absorbing layer).

Example 2

An optical filter is manufactured according to the same method as Example 1 except for changing a stacking order of the first near-infrared absorbing layer and the second near-infrared absorbing layer.

Example 3

An optical filter is manufactured according to the same method as Example 1 except for using Dye 2 instead of Dye 1.

Example 4

An optical filter is manufactured according to the same method as Example 1 except for using Copper Phosphate Salt 2 instead of Copper Phosphate Salt 1.

Comparative Example 1

An optical filter is manufactured according to the same method as Example 1 except for using Dye 3 instead of Dye 1.

Comparative Example 2

An optical filter is manufactured according to the same method as Example 1 except for using Dye 4 instead of Dye 1.

Comparative Example 3

An optical filter is manufactured according to the same method as Example 1 except for disposing no second near-infrared absorbing layer.

Comparative Example 4

An optical filter is manufactured according to the same method as Example 3 except for disposing no second near-infrared absorbing layer.

Comparative Example 5

An optical filter is manufactured according to the same method as Comparative Example 1 except for disposing no second near-infrared absorbing layer.

Comparative Example 6

An optical filter is manufactured according to the same method as Comparative Example 2 except for disposing no second near-infrared absorbing layer.

Dyes 1 to 4 and Copper Phosphate Salts 1 and 2 respectively have the following structures.

[Dye 1]

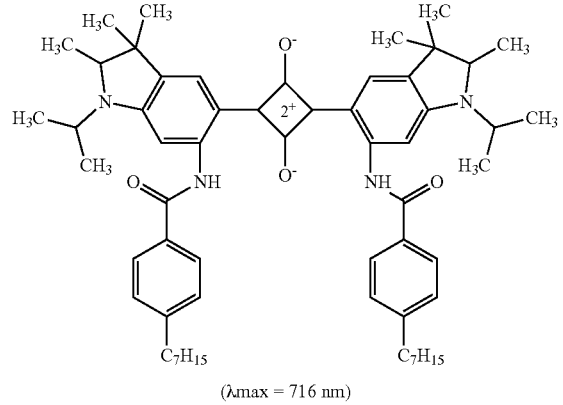

(λmax = 716 nm)

[Dye 2]

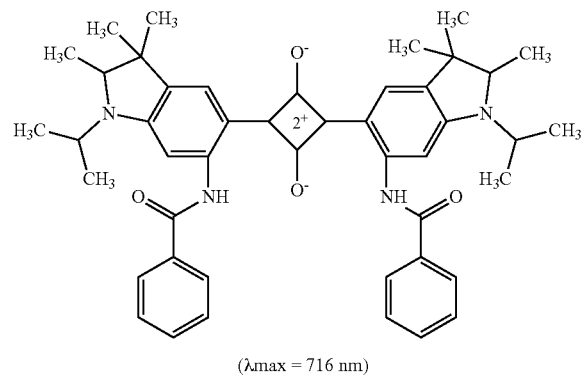

(λmax = 716 nm)

[Dye 3]

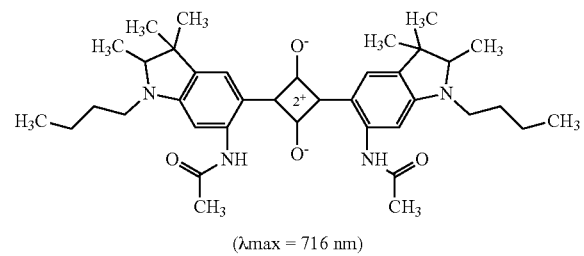

(λmax = 716 nm)

[Dye 4]

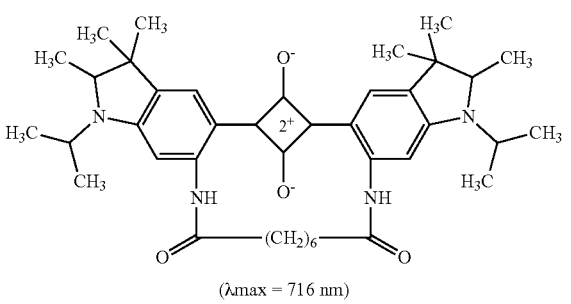

(λmax = 716 nm)

[Copper Phosphate Salt 1]

[Copper Phosphate Salt 2]

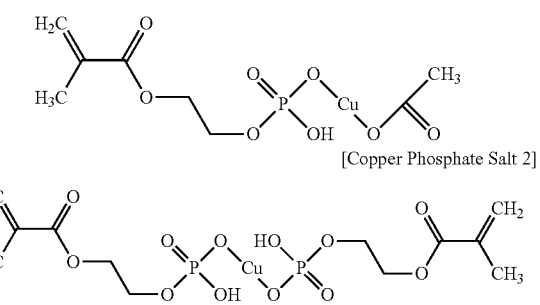

Evaluation 1

Light absorption characteristics depending on a wavelength region of the optical filters according to Examples and Comparative Examples are evaluated.

The light absorption characteristics are measured by using a UV-Vis spectrophotometer (SoldiSpec-3700, Shimadzu Corp.).

The results are shown in Table 1 and FIGS. 10 to 13.

TABLE 1

| | light transmittance in a range from 430 nm to 565 nm (%) | average light transmittance in a range from 700 nm to 740 nm (%) | Wavelength (nm) at which light transmittance is 50% |
|---|---|---|---|
| Example 1 | 86.5 | 2.0 | 633 |
| Example 2 | 86.5 | 2.0 | 633 |
| Example 3 | 86.4 | 2.4 | 637 |
| Example 4 | 86.5 | 2.2 | 635 |
| Comparative Example 1 | 86.8 | 4.1 | 626 |
| Comparative Example 2 | 86.2 | 5.7 | 625 |
| Comparative Example 3 | 88.2 | 3.7 | 646 |
| Comparative Example 4 | 88.9 | 8.7 | 672 |
| Comparative Example 5 | 90.1 | 22.1 | 656 |
| Comparative Example 6 | 87.4 | 13.9 | 629 |

Referring to Table 1 and FIGS. 10 to 13, the optical filters according to Examples 1 to 4 show high light transmittance of greater than or equal to about 86% in a visible region, but lower light transmittance in a near-infrared region (for example, average light transmittance of less than or equal to 3% and specifically, less than or equal to 2.5% at 700 nm to 740 nm) compared with the optical filters according to Comparative Examples 1 to 2. Particularly, when a near-infrared absorbing layer including a dye and a near-infrared absorbing layer including a copper complex compound are stacked, a wavelength at which light transmittance is 50% ranges from 630 nm to 640 nm.

While some example embodiments have been described, it is to be understood that inventive concepts not limited to the disclosed embodiments, but, on the contrary, are intended to cover various modifications and equivalent arrangements included within the spirit and scope of the appended claims.

What is claimed is:

1. A near-infrared absorbing film, comprising
a polymer film,
a first near-infrared absorbing layer on the polymer film, the first near-infrared absorbing layer configured to transmit light in a visible region and to selectively absorbing at least one part of light in a near-infrared region, and
a second near-infrared absorbing layer on a surface of the first near-infrared absorbing layer,
the first near-infrared absorbing layer including a dye represented by Chemical Formula 1, and
the second near-infrared absorbing layer including a copper complex compound,

[Chemical Formula 1]

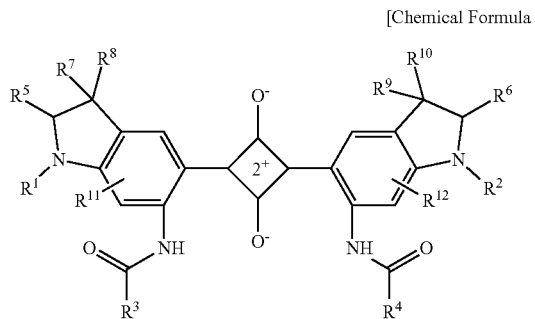

wherein, in Chemical Formula 1,
$R^1$, $R^2$, and $R^5$ to $R^{12}$ are independently one of a hydrogen atom, a substituted or unsubstituted C1 to C20 alkyl group, or a substituted or unsubstituted C6 to C20 aryl group, and
$R^3$ and $R^4$ independently include one of a substituted or unsubstituted C6 to C20 aryl group.

2. The near-infrared absorbing film of claim 1, wherein $R^3$ and $R^4$ are independently a C6 to C20 aryl group substituted or unsubstituted with a C1 to C10 alkyl group.

3. The near-infrared absorbing film of claim 1, wherein the dye represented by Chemical Formula 1 has a maximum absorption wavelength ($\lambda_{max}$) in a wavelength region of about 715 nm to about 725 nm.

4. The near-infrared absorbing film of claim 1, wherein the copper complex compound includes a copper phosphate salt.

5. The near-infrared absorbing film of claim 4, wherein the copper phosphate salt includes a structure represented by one of Chemical Formula 2-1 to Chemical Formula 2-3:

[Chemical Formula 2-1]

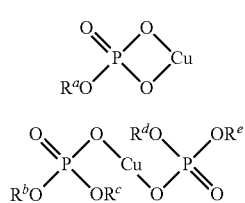

[Chemical Formula 2-2]

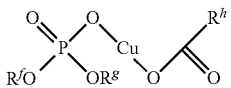

[Chemical Formula 2-3]

wherein, in Chemical Formula 2-1 to Chemical Formula 2-3,
$R^a$ to $R^h$ are independently one of a hydrogen atom or a substituted or unsubstituted C1 to C20 alkyl group.

6. The near-infrared absorbing film of claim 1, wherein the near-infrared absorbing film has an average light transmittance of about 50% in a wavelength region of about 630 nm to about 640 nm.

7. The near-infrared absorbing film of claim 1, wherein the first near-infrared absorbing layer further includes an organic binder.

8. The near-infrared absorbing film of claim 7, wherein the organic binder includes one of a thermally curable binder, a photo-curable binder, or a combination thereof.

9. The near-infrared absorbing film of claim 8, wherein the first near-infrared absorbing layer further includes one of a cyanine-based dye, a phthalocyanine-based dye, a dithiolene metal complex dye, a diimmonium-based dye, or a combination thereof.

10. The near-infrared absorbing film of claim 1, wherein the polymer film includes one of polyethyleneterephthalate, polyethylenenaphthalate, triacetyl cellulose, polycarbonate, cycloolefin polymer, poly(meth)acrylate, polyimide, or a combination thereof.

11. The near-infrared absorbing film of claim 1, wherein the polymer film is configured to selectively absorb at least one part of light in an ultraviolet (UV) region.

12. The near-infrared absorbing film of claim 1, wherein the first near-infrared absorbing layer is between the polymer film and the second near-infrared absorbing layer.

13. The near-infrared absorbing film of claim 1, wherein the second near-infrared absorbing layer is between the polymer film and the first near-infrared absorbing layer.

14. The near-infrared absorbing film of claim 13, wherein the near-infrared absorbing film has an average light transmittance of less than or equal to about 2.5% in a wavelength region of about 700 nm to about 740 nm.

15. An optical filter comprising
the near-infrared absorbing film of claim 1; and
an infrared blocking layer on one surface or both surfaces of the near-infrared absorbing film.

16. The optical filter of claim 15, wherein
the infrared blocking layer including a first layer and a second layer containing materials having different refractive indexes, and
the infrared blocking layer is a multilayer where the first layer and the second layer are alternately and repeatedly stacked.

17. The optical filter of claim 15, wherein the infrared blocking layer is configured to limit light in a wavelength region of about 700 nm to about 1200 nm.

18. The optical filter of claim 15, wherein the near-infrared absorbing film has a thickness of about 50 μm to about 250 μm.

19. An electronic device comprising:
the optical filter of claim 15.

20. The electronic device of claim 19, wherein
the electronic device includes a lens and an image sensor, and
the optical filter is between the lens and the image sensor.

21. A near-infrared absorbing film, comprising
a polymer film; and
a near-infrared absorbing layer on the polymer film,
   the near-infrared absorbing layer including a dye represented by Chemical Formula 1 and a copper phosphate compound,
   the dye represented by Chemical Formula 1 being configured to transmit light in a visible region and to absorb light in a first part of a near-infrared region,
   the copper phosphate compound being configured to absorb light in a second part of the near-infrared region,

[Chemical Formula 1]

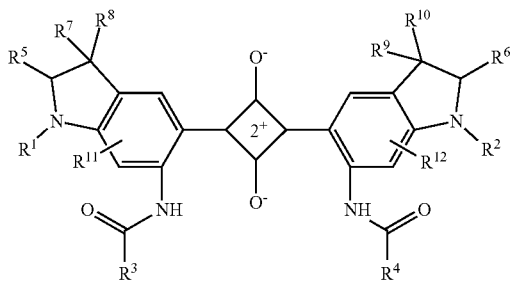

wherein, in Chemical Formula 1,
$R^1$, $R^2$, and $R^5$ to $R^{12}$ are independently one of a hydrogen atom, a substituted or unsubstituted C1 to C20 alkyl group, or a substituted or unsubstituted C6 to C20 aryl group, and
$R^3$ and $R^4$ are independently one of an unsubstituted C6 to C20 aryl group or a C6 to C20 aryl group substituted with a C1 to C10 alkyl group.

22. The near-infrared absorbing film of claim 21, wherein the copper phosphate compound includes a structure represented by one of Chemical Formula 2-1 to Chemical Formula 2-3,

[Chemical Formula 2-1]

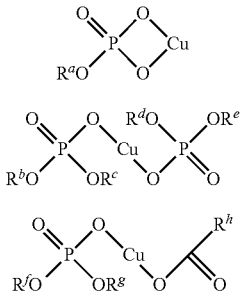

[Chemical Formula 2-2]

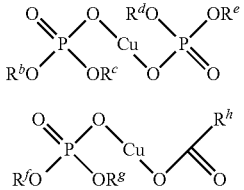

[Chemical Formula 2-3]

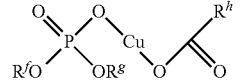

wherein, in Chemical Formula 2-1 to Chemical Formula 2-3,
$R^a$ to $R^h$ are independently one of a hydrogen atom or a substituted or unsubstituted C1 to C20 alkyl group.

23. The near-infrared absorbing film of claim 21, wherein the near-infrared absorbing layer further includes one of a cyanine-based dye, a phthalocyanine-based dye, a dithiolene metal complex dye, a diimmonium-based dye, or a combination thereof.

24. The near-infrared absorbing film of claim 21, wherein
the near-infrared absorbing layer includes a first near-infrared absorbing layer and a second near-infrared absorbing layer,
the first near-infrared absorbing layer includes the dye represented by Chemical Formula 1,
the second near-infrared absorbing layer includes the copper phosphate compound,
the first near-infrared absorbing layer includes a binder,
the first near-infrared absorbing layer includes the dye represented by Chemical Formula in an amount that is in a range that is greater than 0 parts by weight and less than or equal to about 10 parts by weight based on 100 parts by weight of the binder.

25. An electronic device comprising:
an image sensor; and
the near-infrared absorbing film of claim 21 on the image sensor.

* * * * *